(12) United States Patent
Abutarboush et al.

(10) Patent No.: US 12,689,107 B1
(45) Date of Patent: Jul. 21, 2026

(54) FANO INTERFEROMETRIC PHASE DETECTOR BASED PHASE LOCKED LOOP

(71) Applicant: Taibah University, Madinah (SA)

(72) Inventors: Hattan F. Abutarboush, Madinah (SA); Muhammad Amin, Madinah (SA); Omar F. Siddiqui, Madinah (SA); Rashad Ramzan, Islamabad (PK)

(73) Assignee: Taibah University, Medina (SA)

( * ) Notice: Subject to any disclaimer, the term of this patent is extended or adjusted under 35 U.S.C. 154(b) by 27 days.

(21) Appl. No.: 19/031,758

(22) Filed: Jan. 18, 2025

(51) Int. Cl.
| | |
|---|---|
| *H01P 3/08* | (2006.01) |
| *H01P 1/20* | (2006.01) |
| *H01P 1/203* | (2006.01) |
| *H03L 7/085* | (2006.01) |

(52) U.S. Cl.
CPC ............ *H01P 1/203* (2013.01); *H01P 1/2002* (2013.01); *H01P 3/081* (2013.01); *H03L 7/085* (2013.01)

(58) Field of Classification Search
None
See application file for complete search history.

(56) References Cited

U.S. PATENT DOCUMENTS

| | | | | |
|---|---|---|---|---|
| 8,704,618 B2 * | 4/2014 | Nusair | ............... | H01P 1/20381 |
| | | | | 333/204 |
| 10,177,772 B2 * | 1/2019 | Zhuang | ................ | H03L 7/0898 |
| 10,186,743 B2 * | 1/2019 | Ramzan | ............... | H01P 1/2039 |
| 10,186,744 B2 * | 1/2019 | Ramzan | ................... | H01P 7/08 |
| 12,153,000 B2 * | 11/2024 | Herth | ................... | G01N 33/386 |
| 2025/0233723 A1 * | 7/2025 | Almoneef | ............ | H04L 5/1461 |

* cited by examiner

*Primary Examiner* — Thomas J. Hiltunen
(74) *Attorney, Agent, or Firm* — MUGHAL GAUDRY & FRANKLIN PC

(57) ABSTRACT

A fano interferometric phase detector comprising a dielectric core with a top surface and a bottom surface, wherein the top surface and the bottom surface are substantially parallel. The phase detector includes a main transmission line on the top surface and a first quarter wavelength stub on the top surface electrically coupled to the main transmission line. The phase detector includes a second quarter wavelength stub on the top surface electrically coupled to the main transmission line, and a port line on the top surface, wherein the port line is an extension above the main transmission line. The phase detector further includes a ground plane on the bottom surface, wherein the dielectric core insulates the ground plane from the main transmission line, the first quarter wavelength stub, the second quarter wavelength stub, and the port line.

20 Claims, 11 Drawing Sheets

FANO INTERFEROMETRIC PHASE DETECTOR BASED PHASE LOCKED LOOP

TECHNICAL FIELD

At least one example generally relates to phase detectors and more particularly to a fano interferometric phase detector that may use a fano resonance phenomenon to detect a phase difference between two signals in a millimeter-wave frequency range for applications such as a phase locked loop.

BACKGROUND

Phase detection may be used to synchronize signals for achieving system stability in high-frequency systems such as automotive radar, synthetic aperture radar (SAR) satellite systems, and massive multiple input and multiple output (MIMO) base stations. The detection accuracy and range of automotive radar systems may depend on phase alignment of signals, while massive MIMO base stations may need stable phase control to enable transmissions from a multi-antenna system. Conventional phase detectors may have limitations at higher frequencies such as bandwidth limitation, phase noise, and latency, especially when operating above tens of gigahertz. Phase accuracy may be significantly reduced when one or more frequency dividers may be employed to reduce the frequency of a signal to make it compatible with conventional phase detectors, as it may average out the impact of fine grain small variations in the phase of a high frequency signal.

The background description provided here is for the purpose of generally presenting the context of the disclosure. Unless otherwise indicated here, the material described in this section is not prior art to the claims in this application and is not admitted to be prior art by inclusion in this section.

BRIEF DESCRIPTION OF THE DRAWINGS

At least one embodiment may be understood more fully from detailed description given below and from accompanying drawings, which, however, should not be taken to be limiting, but are for explanation and understanding.

Figure 1A:
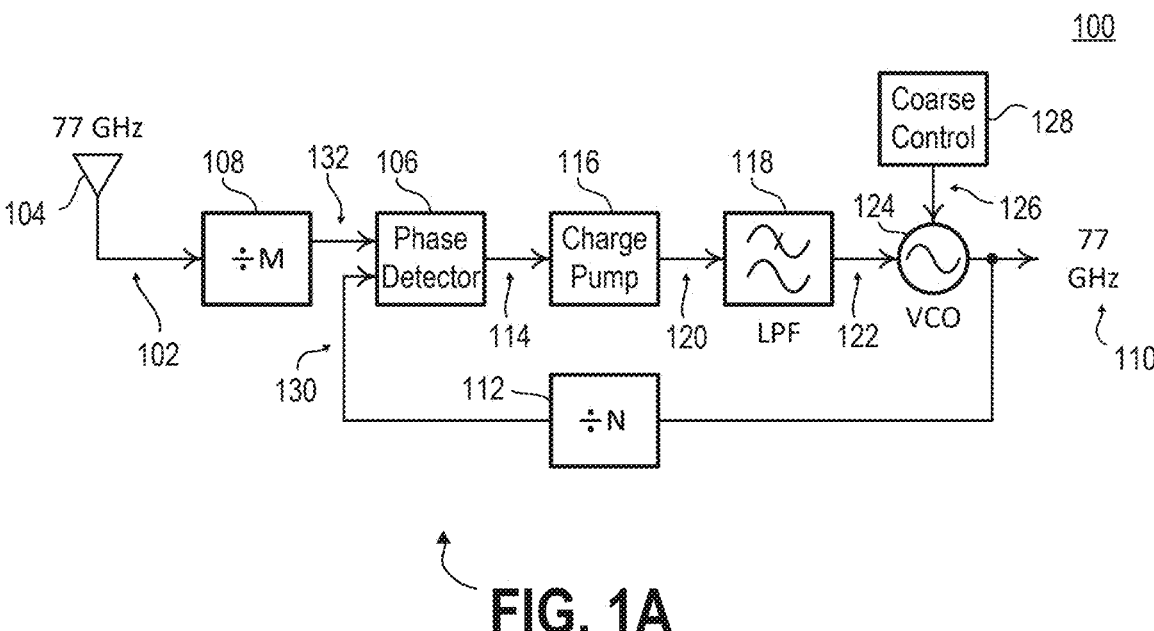
FIG. 1A is a schematic illustrating a conventional Phase Locked Loop (PLL) with a reference signal of, for instance, 77 gigahertz, in accordance with at least one example.

| GLOSSARY OF SYMBOLS | |
| --- | --- |
| PLL | Phase locked loop. |
| PD | Phase detector. |
| FIPD | Fano interferometric phase detector. |
| MIMO | Multiple input multiple output. |
| RF | Radio frequency. |
| M, N | Frequency dividing factors. |
| LPF | Low pass filter. |
| VCO | Voltage controlled oscillator. |
| EIT | Electromagnetically induced transparency. |
| SAR | Synthetic Aperture Radar |
| $\Delta\varnothing$ | Phase difference in input signals. |
| $L_p$ | Length of a port line. |
| $L_s$ | Length of a quarter wavelength stub. |
| $L_t$ | Length of a main transmission line. |
| W | Width of a conductive trace. |
| $U(\omega)$ | Output frequency response. |
| $R_b(\omega)$ | Lorentzian frequency response. |
| $\sigma(\omega)$ | Asymmetric frequency response. |
| SAR | Synthetic aperture radar. |

DETAILED DESCRIPTION

A phase-locked loop (PLL) can use a phase detector (PD) to compare phase differences between reference and feedback signals, generating an error signal that may drive the loop towards a phase lock state. Phase detectors are typically created using transistors and they may encounter performance limitations at high frequencies, especially in the frequency range above tens of gigahertz, where performance may be degraded due to signal delays, limited bandwidth, and accumulated phase noise.

When a high-frequency signal, e.g., at or above 77 GHz, is directly input to a the PLL, it may often exceed an operational bandwidth of the phase detector, resulting in a failure of the PLL to lock accurately that may result in unstable operations. This instability may manifest itself with an increase in jitter values that may increase measurement errors of phase of a signal, as the phase detector may not be able to measure phase differences accurately with a desired resolution at such high frequencies. Consequently, in high-frequency applications, such as automotive radars, SAR satellite systems, and MIMO communication systems, may need to use complex frequency divider circuits or other suitable alternative methods to address these limitations.

Most high-frequency PLL designs may include a 1/N frequency divider in a feedback loop to solve these limitations of the phase detector. The divider may reduce the frequency of a signal before it reaches the phase detector, allowing the detector to remain functional at a lower frequency with an acceptable performance. This frequency division method may increase the operational range of the phase detector, but a 1/N divider may increase its complexity, latency, and phase noise; as a result, substantially reducing phase accuracy of the phase detector. Consequently, this may degrade the overall performance of the phase detector, especially in applications that may need the phase detector to operate at high frequencies but with a lower phase noise.

At least one example provides a high frequency phase detector that can operate above 50 GHz, eliminating the need for frequency dividers that typically add complexity and noise to the detector. Such a phase detector may provide a solution for high frequency communication systems including automotive radar and MIMO applications. In at least one example, the high frequency phase detector is a fano interferometric phase detector (FIPD), which may address the limitations discussed herein by enabling the phase detector to operate at frequencies of, for instance, 77 GHz or higher. This high-speed, low-latency phase detector can be optimized to operate at ultra-high frequencies by reducing both phase noise and jitter. This optimization may include eliminating active components in a feedback loop, such as the 1/N frequency divider circuit. Consequently, a PLL design may be simplified having a better stability, less power consumption, and a better lock speed that might be a few desired key characteristics of high-frequency communication systems.

A fano interferometric phase detector may be suitable for high-frequency applications like automotive radar, SAR satellite systems, and massive MIMO communication systems, where phase stability and precision at high frequencies are desired features. In automotive radars, operating directly at millimeter-wave frequencies range may improve both its resolution and range, leading to an increase in accuracy of object detection and object tracking. In high-frequency MIMO systems, a fano interferometric phase detector may improve phase coherence, resulting in increased data transfer rates and reduced interference between signals.

At least one example of a fano interferometric phase detector comprises a pair of cascaded open-circuit quarter-wavelength stubs that may be connected through a main transmission line. Each stub may be attached to a main transmission line using two nodes based on their proximity to ports located at either end of a main transmission line, respectively. The pair of quarter-wavelength stubs may be placed at a distance along the main transmission line. This distance can be used for detuning resonances that may originate from primary and secondary stubs of a pair of quarter-wavelength stubs. When two voltage signals are applied at ports of the main transmission line, a voltage at one of the two nodes may vary depending on a phase difference between two voltage signals. In at least one example, in-phase signals ($\Delta\emptyset=0°$) at ports may induce a symmetric voltage response, and out-of-phase ($\Delta\emptyset=180°$) signals at ports may induce an asymmetric voltage response at one of two nodes.

In the following description, numerous details are provided as examples of the present disclosure. It will be apparent, however, to one skilled in the art, that examples of the present disclosure may be practiced without these specific details. In other instances, well-known structures and devices are shown in a block diagram form, rather than in detail, to avoid obscuring examples of the present disclosure.

Note that in corresponding drawings of different examples, curves are represented with lines. Some lines may be thicker or dashed to differentiate between them. Such indications are not intended to be limiting. Rather, lines are used in connection with one or more examples to facilitate an easier understanding of an illustrated plot.

It is important to emphasize that those elements of different figures that have same reference numbers (or names) may operate or function in a manner like the one described but may not be limited to such.

FIG. 1A is a schematic illustrating a PLL 100 with a reference signal 102 of, for instance, 77 gigahertz, in accordance with at least one example. Reference signal 102 may be a radio frequency (RF) signal received using a receiver 104. In at least one example, phase detector 106 may be a transistor-based low-frequency phase detector that may detect phase difference in two or more signals of low frequencies (such as signals of 100-megahertz frequency). Frequency of reference signal 102 may be divided by a frequency divider 108 that has a dividing factor M. PLL 100 may output a signal 110 of a reference frequency of, for instance, 77 gigahertz, which may be divided using a frequency divider 112 by a factor N to match a 100-megahertz frequency of a phase detector 106.

Input signal 132 and feedback signal 130 are input to phase detector 106 that may detect a phase difference between signals 132 and 130 and output a phase error signal 114 depending on value of phase difference. In at least one example, a charge pump 116 may be positioned between phase detector 106 and a low pass filter (LPF) 118 to convert phase error signal 114, generated by phase detector 106, into a corresponding current signal 120. Current signal 120 may be processed by a low pass filter 118 to filter high-frequency noise and may produce a stable fine control voltage 122 for driving a voltage-controlled oscillator (VCO) 124. In at least one example, VCO 124 may also be controlled using a coarse control voltage 126 generated by a coarse control 128 to match an operational frequency of PLL 100 (e.g., 77 gigahertz for PLL 100). In at least one example, fine control voltage 122 may adjust VCO 124 to decrease a phase in difference between input signal 132 and feedback signal 130 driving PLL 100 to achieve a phase lock state.

In at least one example, PLL 100 uses frequency dividers 108 and 112 to match operational frequency of phase detector 106. Due to frequency divider circuits, accuracy of phase difference between signals 102 and 110 may substantially decrease. This phenomenon limits operation at higher frequencies where smaller changes in phase difference might be needed for reliable communication of systems. Moreover, dividers 108 and 112 may utilize large power, thereby resulting in a significant increase of power consumption of PLL 100. Additionally, frequency dividers 108 and 112 may also introduce latency and phase noise into PLL 100, which may further degrade performance of PLL 100 in systems that may need a precise phase control, such as automotive radars and MIMO communication systems.

Figure 1B:
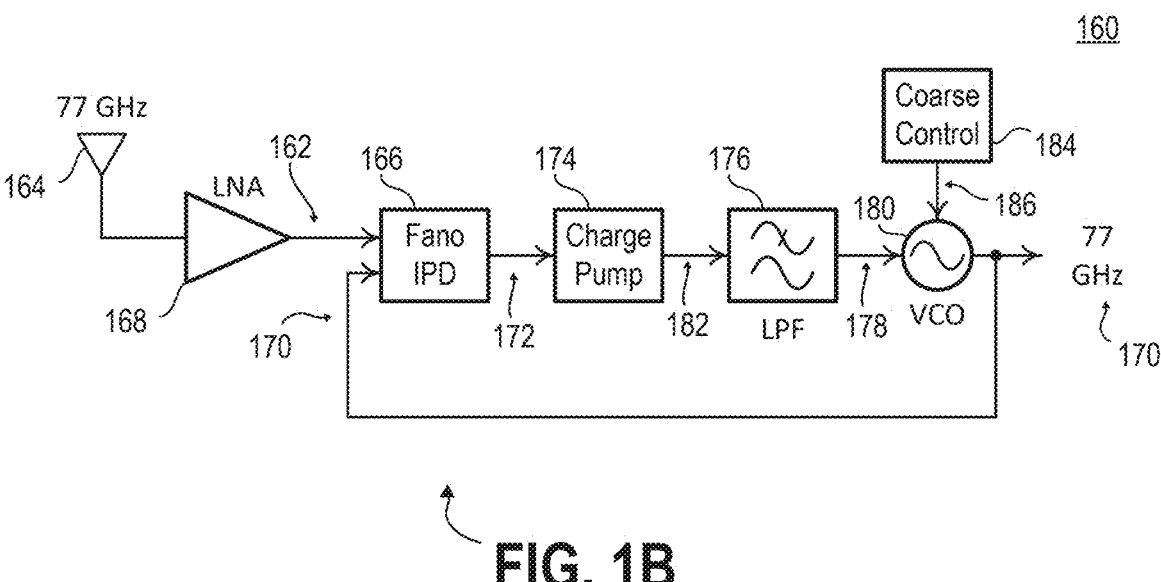
FIG. 1B is a schematic illustrating a PLL comprising a fano interferometric phase detector, in accordance with at least one example.

FIG. 1B is a schematic illustrating a PLL 160 with a fano interferometric phase detector (FIPD) 166, in accordance with at least one example. Unlike phase detector 106, fano interferometric phase detector 166 may be capable of detecting a phase difference in signals of hundreds of gigahertz frequency. PLL 160 may phase lock with an input signal 162 of, for instance 77 gigahertz, and an output an output signal 170 of a frequency of, for instance, 77 gigahertz. Input signal 162 may be an RF signal received from a receiver 164 and amplified using a low noise amplifier (LNA) 168. PLL 160 may be configured to work as PLL 100 but may not need frequency divider circuits, as fano interferometric phase detector 166 may be capable of detecting a phase difference between input signal 162 and output signal 170, each having a frequency of, for instance, 77 gigahertz. Fano interferometric phase detector 166 may output a phase error signal 172, and its magnitude depends on a phase difference between two high frequency signals: input signal 162 and output signal 170. Phase error signal 172 may be given as input to a charge pump 174 to convert phase error signal 172, generated by FIPD 166, into a corresponding current signal 182, and then current signal 182 may be filtered using a low pass filter 176. Current signal 182 may be processed by a low pass filter 176 to filter high-frequency noise and may produce a stable fine control voltage 178 for driving VCO 180. In at least one example, VCO 180 may also be controlled using a coarse control voltage 186 generated by a coarse control 184 to match an operational frequency of PLL 160 (e.g., 77 gigahertz for PLL 160). In at least one example, fano interferometric phase detector 166 may operate at high frequencies, thereby eliminating the need to divide frequencies of signals, thereby reducing phase noise, power consumption, and latency. Consequently, improving accuracy of measurement of phase difference between two high frequency signals compared to PLL 100.

PLL 100 includes a phase detector that produces a DC phase error signal because charge pump and filtering is performed on DC signals for controlling VCO. In at least one example, fano interferometric phase detector 166 may generate an AC phase error signal 172. In at least one example, a rectifier may be positioned between fano interferometric phase detector 166 and charge pump 174 to convert AC phase error signal 172 into a DC signal for charge pump 174. In at least one example, an AC to DC charge pump may be used to generate a DC output based on an amplitude of AC phase error signal 172.

Figure 2A:
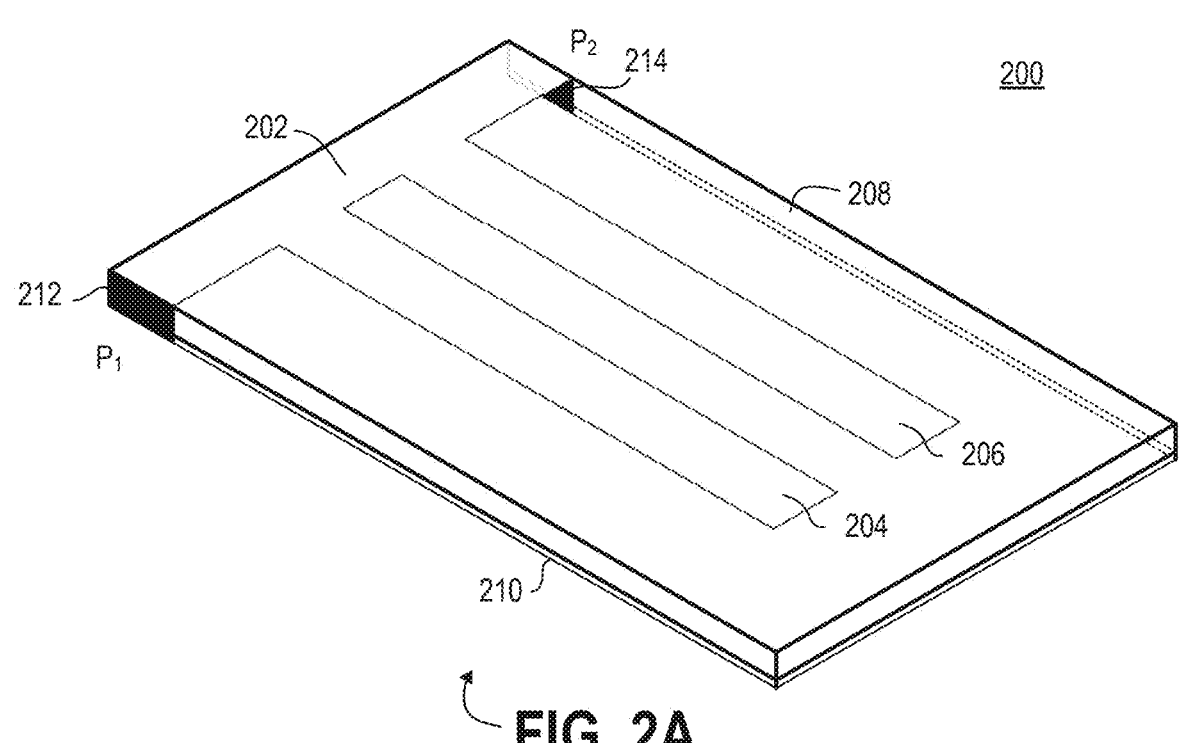
FIG. 2A is a schematic illustrating a structure of a fano resonator, in accordance with at least one example.

FIG. 2A is a schematic illustrating a structure of a fano resonator 200, in accordance with at least one example. Fano resonator 200 comprises a main transmission line 202, a first quarter wavelength stub 204, a second quarter wavelength stub 206, and a ground plane 210. In at least one example, main transmission line 202, first quarter wavelength stub 204, and second quarter wavelength stub 206 are etched on top of a dielectric core 208. In at least one example, a ground plane 210 covers the bottom of dielectric core 208 to overlap main transmission line 202, first quarter wavelength stub 204, and second quarter wavelength stub 206. First quarter wavelength stub 204 and second quarter wavelength stub 206 may be placed at a substantial distance along main transmission line 202 to form two open circuit stubs of fano resonator 200. Fano resonator comprises two ports: a first port 212 on a first end of main transmission line 202, and a second port 214 on a second end of main transmission line 202, in accordance with at least one example.

Figure 2B:
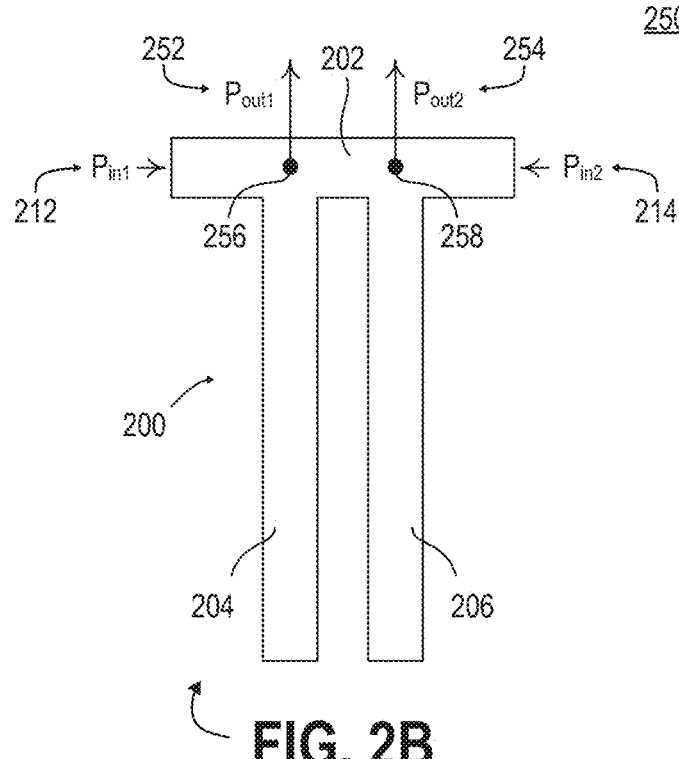
FIG. 2B is a schematic illustrating a port assignment to a fano resonator, in accordance with at least one example.

FIG. 2B is a schematic illustrating a port assignment 250 to a fano resonator 200, in accordance with at least one example. Fano resonator 200 comprises four ports: a first port 212 on a first end of main transmission line 202, a second port 214 on a second end of main transmission line 202, a third port 252 on a first node 256 of main transmission line 202 and first quarter wavelength stub 204, and a fourth port 254 on a second node 258 of main transmission line 202 and second quarter wavelength stub 206. In at least one example, first port 212 and second port 214 are input ports of fano resonator 200, and third port 252 and fourth port 254 are output ports of fano resonator 200. When signals are applied to fano resonator 200 through input ports 212 and 214, quarter wavelength stubs 204 and 206 resonate and a unique voltage amplitude and phase pattern may be observed at nodes 256 and 258. Voltage signals and their phase patterns are measured as output signals at ports 252 and 254. These unique patterns occur due to an interference of signals that are applied at input ports 212 and 214. In at least one example, the interference of signals depends on a phase difference between two input signals, therefore, phase difference of input signals may be measured by observing a voltage pattern at output ports 252 and 254.

Figure 3A:
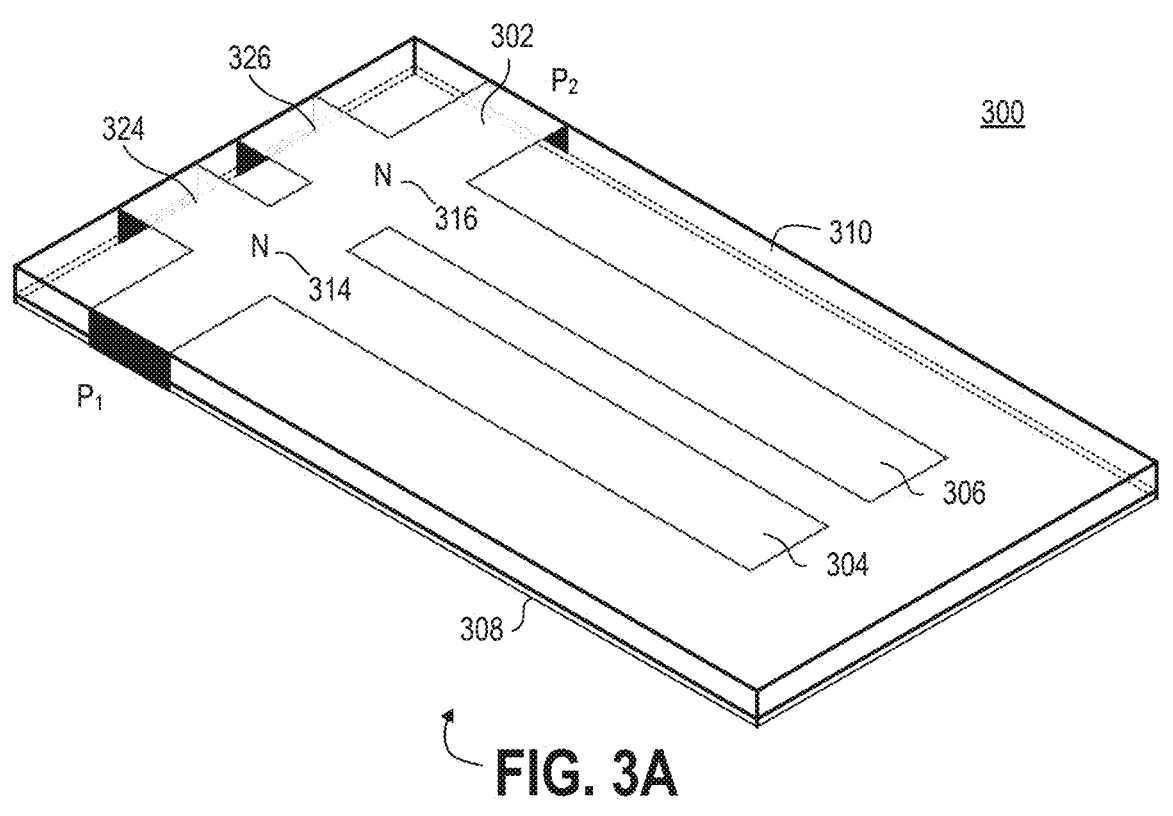
FIG. 3A is a schematic illustrating a structure of a fano interferometric phase detector, in accordance with at least one example.

FIG. 3A is a schematic illustrating a structure of a fano interferometric phase detector 300, in accordance with at least one example. Fano interferometric phase detector 300 comprises a main transmission line 302, a first quarter wavelength stub 304, a second quarter wavelength stub 306, and a ground plane 308. First quarter wavelength stub 304 and second quarter wavelength stub 306 may be placed at a distance along main transmission line 302 to form two open circuit stubs of fano interferometric phase detector 300 at nodes N 314 and N 316. Fano interferometric phase detector 300 features a first port line 324 extending above main transmission line 302 at node N 314 and a second port line 326 extending above main transmission line 302 at node N 316. Main transmission line 302, first quarter wavelength stub 304, second quarter wavelength stub 306, first port line 324, and second port line 326 may be etched on top of dielectric core 310. In at least one example, ground plane 308 may cover a bottom of dielectric core 310 to overlap main transmission line 302, first quarter wavelength stub 304, second quarter wavelength stub 306, first port line 324, and second port line 326. First port line 324 and second port line 326 may be used to extract one or more voltage signals to measure a phase difference between two input signals of fano interferometric phase detector 300.

Figure 3B:
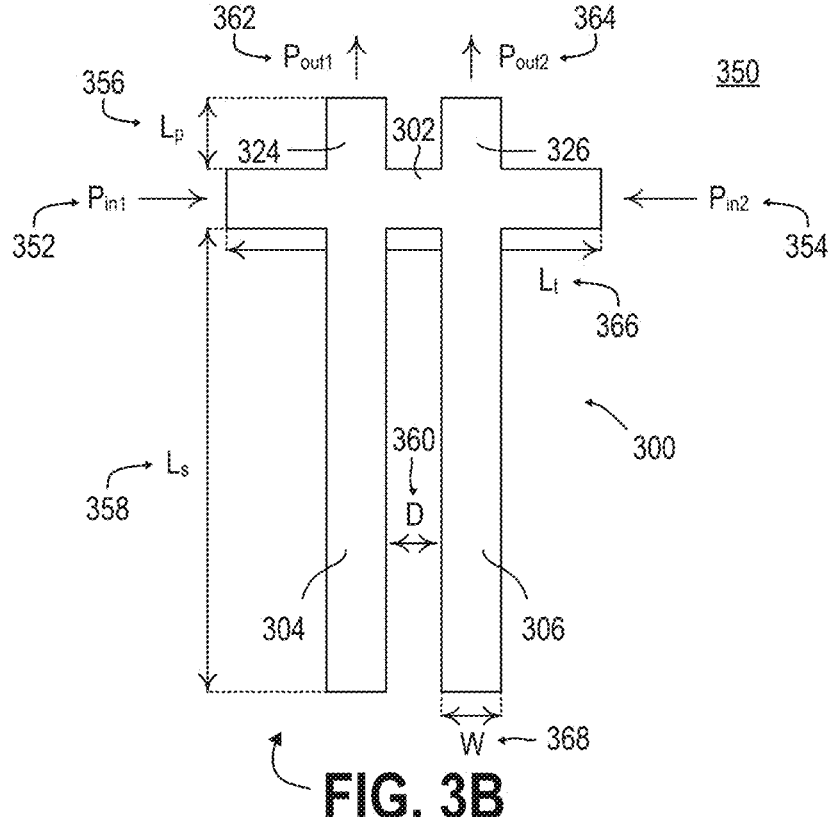
FIG. 3B is a schematic illustrating a port assignment to a fano interferometric phase detector, in accordance with at least one example.

FIG. 3B is a schematic illustrating a port assignment 350 for fano interferometric phase detector 300, in accordance with at least one example. Fano interferometric phase detector 300 may comprise of four ports: a first port 352 on a first end of main transmission line 302, a second port 354 on a second end of main transmission line 302, a third port 362 on an end of first port line 324, and a fourth port 364 on an end of second port line 326. In at least one example, first port 352 and second port 354 are input ports of fano interferometric phase detector 300 and third port 362 and fourth port 364 are output ports of fano interferometric phase detector 300. When signals are applied to fano interferometric phase detector 300 through ports 352 and 354, quarter wavelength stubs 304 and 306 resonate and a unique voltage amplitude and phase pattern may be observed at port lines 324 and 326 that may be measured at ports 362 and 364. These unique patterns may occur due to interference of signals that are applied at input ports 352 and 354. In at least one example, the interference of signals depends on a phase difference between the two input signals. Therefore, phase difference between the two input signals may be measured by observing a voltage pattern at output ports 362 and 364.

In at least one example, first port line 324 and second port line 326 may have an equal length $L_p$ 356 and quarter wavelength stubs 304 and 306 may have an equal length $L_s$ 358. Quarter wavelength stubs 304 and 306 may be spaced with a stub spacing D 360 along main transmission line 302, wherein length Lt 366 of main transmission line 302, length $L_p$ 356 of port lines 324 and 326, length $L_s$ 358 of quarter wavelength stubs 304 and 306, and width W 368 of a trace of each component of fano interferometric phase detector 300 may modify a response of fano interferometric phase detector 300 including a resonance frequency of fano interferometric phase detector 300, in accordance with at least one example.

Figure 4A:
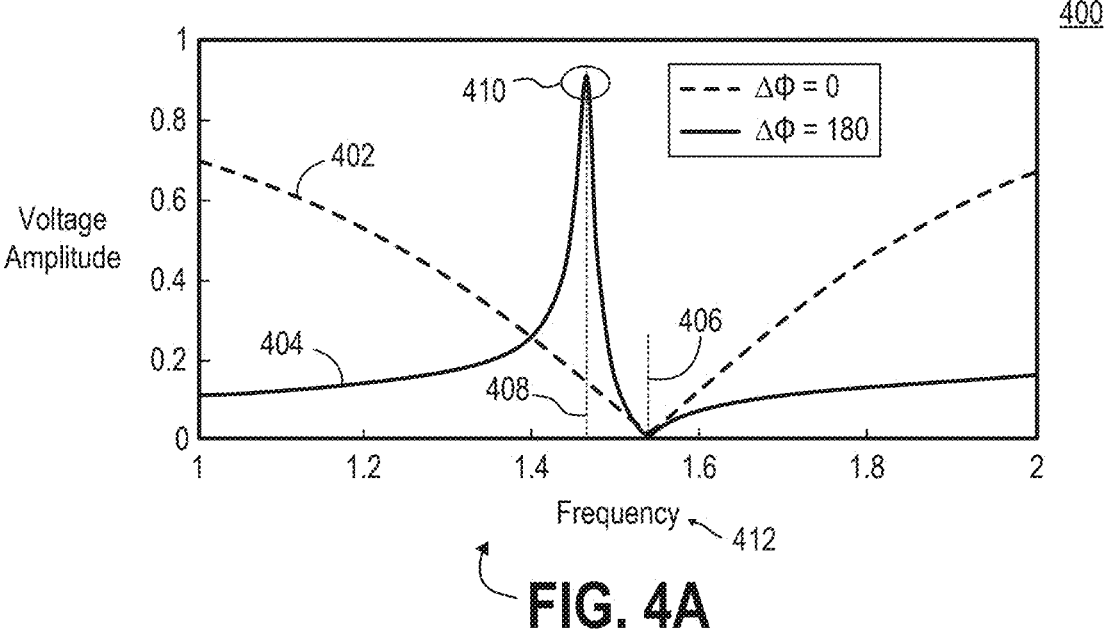
FIG. 4A is a magnitude plot of a node voltage of a fano resonator of FIG. 2B when using in-phase and 180° out-of-phase inputs, in accordance with at least one example.

FIG. 4A illustrates a magnitude plot 400 of a node voltage of fano resonator 200 of FIG. 2B across a normalized frequency range 412 at two inputs, one in-phase and one 180° out-of-phase input, in accordance with at least one example. Input signals are applied at ports 212 and 214 of fano resonator 200, wherein input signals may be in-phase or 180° out-of-phase. Curve 402 shows a voltage response of fano resonator 200 when input signals are in-phase (e.g., a phase difference between two input signals is zero). Curve 404 shows a voltage response of fano resonator 200 when input signals are 180° out-of-phase (e.g., a phase difference between the two signals is) 180° in accordance with at least one example.

Curve 402 illustrates that when input signals are in-phase, a Lorentzian voltage response may be observed with a dip at a first resonant frequency (e.g., approximately 1.55 GHz represented by 406). Curve 404 illustrates that when input signals are 180° out-of-phase, a fano voltage response may be observed with an electromagnetically inducted transparency (EIT) peak 410 at a second resonant frequency (e.g., of approximately 1.46 GHz represented by 408). When phases of signals are aligned (e.g., in-phase), they produce constructive interference, which may result in amplifying a signal. Conversely, when phases of signals are out of alignment (e.g., out-of-phase), this may result in a destructive interference, which may result in amplitude cancelation of two signals.

Unlike traditional resonators, fano resonator 200 may be capable of producing two resonant spectral outputs, background continuum state ($R_b$) or discrete asymmetric state ($\sigma$), depending on a phase difference ($\Delta\Phi$) between input signals. Thus, a frequency-dependent output signal $U(\omega)$ may be represented in phasor notation as $U(\omega)$ in eq. 1.

$$U(\omega) = \begin{cases} R_b(\omega), & \Delta\phi = 0 \\ \sigma(\omega), & \Delta\phi = 180 \\ R_b(\omega)(1 + e^{i\Delta\phi}) + \sigma(\omega)(1 - e^{i\Delta\phi}), & \text{otherwise} \end{cases} \qquad \text{Eq. 1}$$

In at least one example, for in-phase input signals ($\Delta\Phi=0$), amplitude response of both voltages at nodes 256 and 258 may be identical and hence can be termed as a Lorentzian resonance phenomenon. This interference response may generate a Lorentzian line shape that may be represented as an output signal $U(\omega)=R_b(\omega)$ in Eq. 1. Similarly, for out-of-phase input signals ($\Delta\Phi=180$), interference of a node voltage at output ports 252 and 254 leads to a fano line shape with an asymmetric profile modeled as $U(\omega)=\sigma(\omega)$ in Eq. 1. In at least one example, resonant frequency 406 of curve 402 and frequency 408 of EIT peak 410 in curve 404 may be misaligned due to a given structure of fano resonator 200. In at least one example, resonator structure 200 may not behave as a phase detector as voltage change, corresponding to a phase difference, doesn't occur at a single frequency.

Figure 4B:
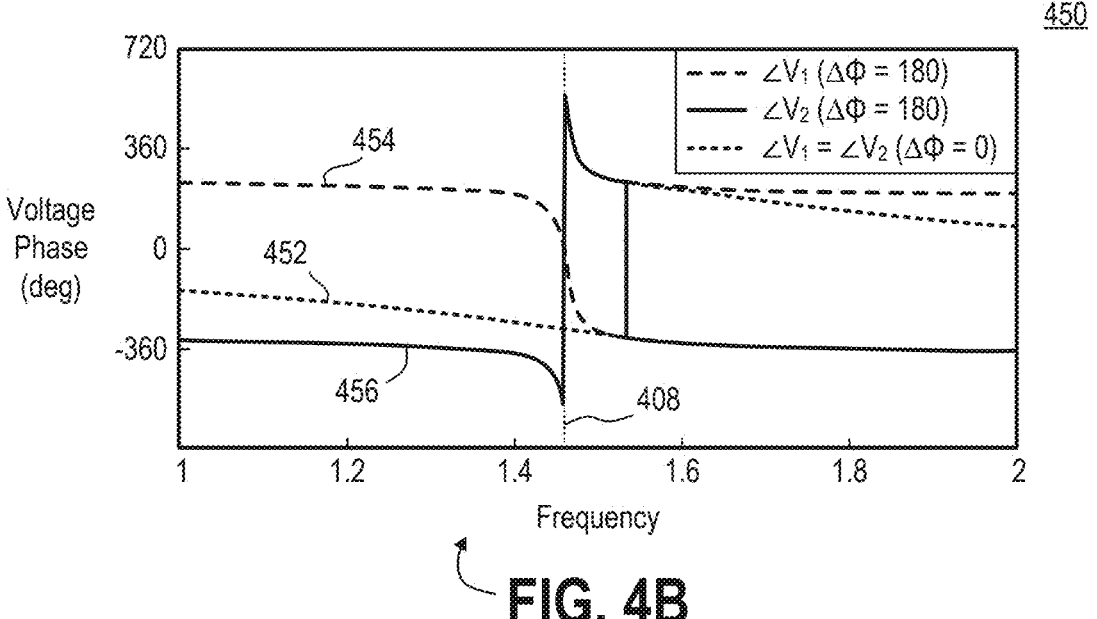
FIG. 4B is a phase plot of node voltages of a fano resonator of FIG. 2B, in accordance with at least one example.

FIG. 4B illustrates a plot 450 of node voltage phases of fano resonator 200 of FIG. 2B, in accordance with at least one example. Phase curve 452 shows a phase of node voltage signals at ports 252 and 254 when input signals of fano resonator 200 are in-phase, wherein both node voltages are equal in amplitude and in-phase, in accordance with at least one example. Phase curves 454 and 456 show that when input signals are out-of-phase, phase curves of node voltages differ even though amplitude remains the same as illustrated in plot 400. Curves 454 and 456 show that phase of node voltage signals at ports 252 and 254 are 180 out-of-phase corresponding to EIT peak 410 of FIG. 4A at frequency 408. Shifts in phase may occur at different frequencies (e.g., spectrally misaligned) rather than a single frequency for input signals with a varying phase difference as illustrated by curves 452, 454, and 456, in accordance with at least one example.

In at least one example, plots 400 and 450 illustrate that node voltage signals may have same amplitude for input signals but with a difference in phase difference. Moreover, phase response of node voltage signals may be similar when input signals of fano resonator 200 are in-phase. When input signals of fano resonator 200 are out-of-phase, phase response of node voltage signals may also change. In at least one example, node voltage signals applied to fano resonator 200 at ports 252 and 254 may exhibit amplitude variations corresponding to a phase difference between input signals: a small amplitude when a small phase difference exists between two input signals ($\Delta\Phi=0$), and a large amplitude when a large phase difference exists between two input signals ($\Delta\Phi=180$). These amplitude variations may not remain confined to a single spectral frequency; instead, associated frequencies may dynamically shift.

Figure 5A:
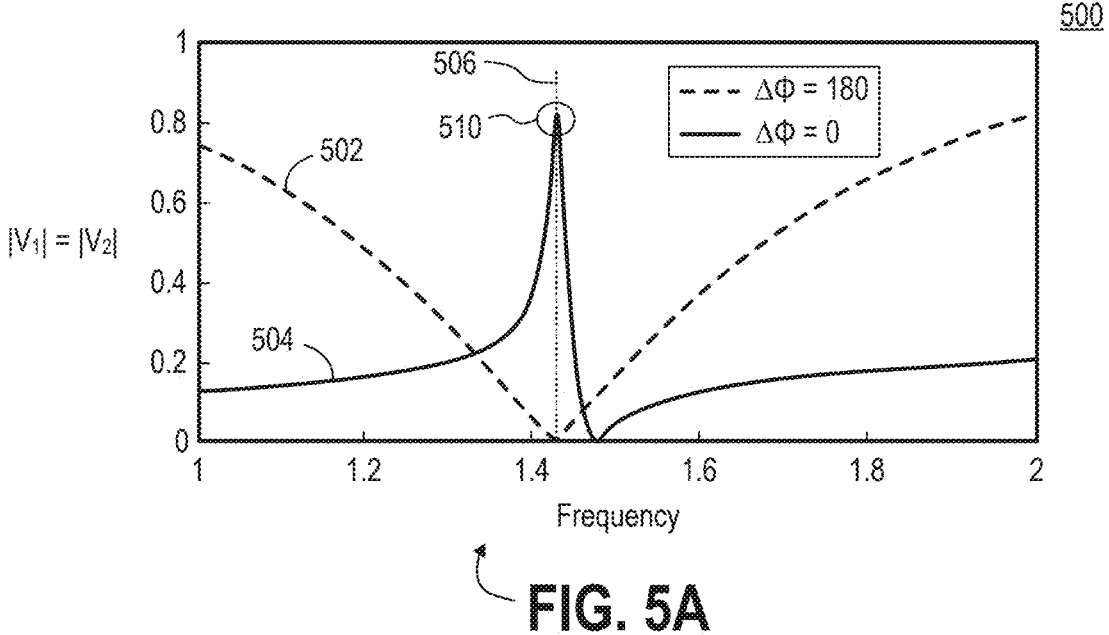
FIG. 5A is a magnitude plot of a voltage at an output port of a fano interferometric phase detector when using in-phase and 180° out-of-phase inputs, in accordance with at least one example.

FIG. 5A illustrates a magnitude plot 500 of a voltage signal at an output port (362 or 364) of a fano interferometric phase detector 300 when two inputs are in-phase and 180° out-of-phase inputs, in accordance with at least one example. Voltage signals at ports 362 and 364 of a fano interferometric phase detector 300 may have the same amplitude as voltages at ports 252 and 254 of fano resonator 200, in accordance with at least one example. Magnitude of one of voltage signals at ports 362 and 364 of fano interferometric phase detector 300 is shown in plot 500 since both voltage signals have the same amplitude. Curve 502 shows a voltage amplitude when both input signals at ports 352 and 354 of fano interferometric phase detector 300 are in-phase, in accordance with at least one example. Curve 504 shows a voltage amplitude when both input signals at ports 352 and 354 of fano interferometric phase detector 300 are 180° out-of-phase, in accordance with at least one example. Curve 502 shows that when input signals are in-phase, a lorentzian voltage response may be observed with a dip at resonant frequency represented by 506 similar to a lorentzian response observed in curve 402 ($U(\omega)=R_b(\omega)$ in eq. 1). Curve 504 shows that when two input signals are 180° out-of-phase, a fano voltage response may be observed at an EIT peak 510 at resonant frequency represented by 506 like a fano response of curve 404 (U(ω)=σ(ω) in eq. 1).

In at least one example, dip of curve 502 and EIT peak 510 of curve 504 may be spectrally aligned at a single frequency 506, which depends on a structure of fano interferometric phase detector 300, due to port lines 324 and 326, and this in contrast to spectrally misaligned dip and peaks of curves 402 and 404. Port lines 324 and 326 modulate voltage interference within fano interferometric phase detector 300, ensuring that voltages at ports 362 and 364 maintain approximately the same amplitudes. Additionally, variations in voltage signals at ports 362 and 364, caused by changes in phase difference of input signals at ports 352 and 354, are spectrally aligned with a single frequency value pointed by 506.

Figure 5B:
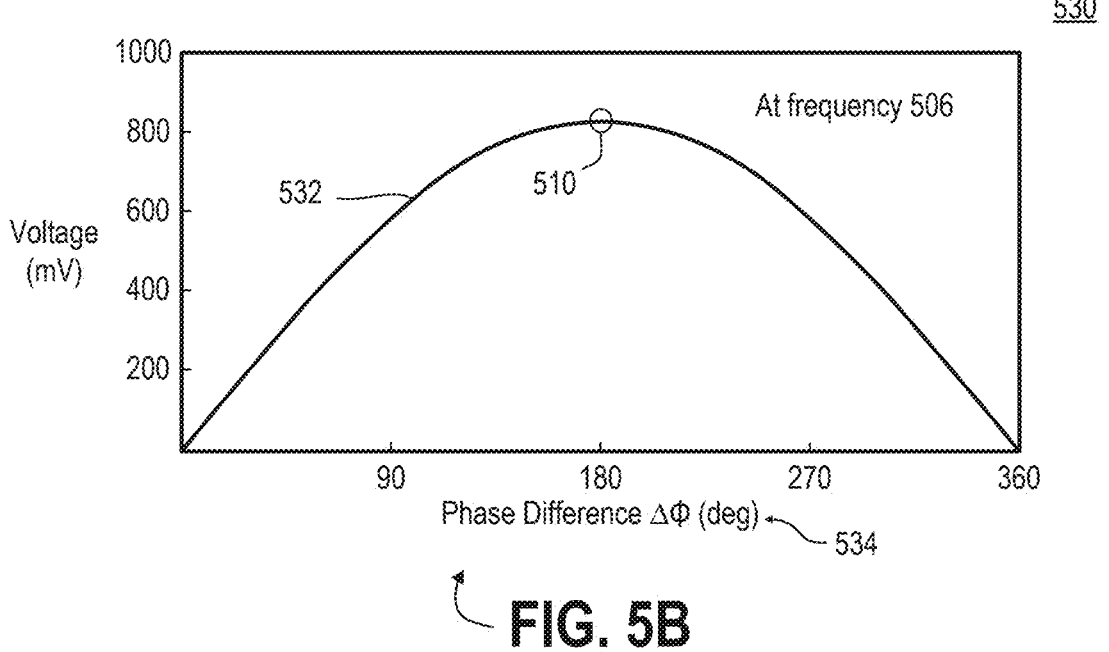
FIG. 5B is a magnitude plot of a voltage at an output port of a fano interferometric phase detector illustrating its change with a variation in a phase difference of input signals, in accordance with at least one example.

FIG. 5B illustrates a magnitude plot 530 of a voltage at an output port (output port 362 or output port 364) of fano interferometric phase detector 300 illustrating a change in voltage amplitude with a variation in a phase difference of input signals at ports 352 and 354 at frequency value pointed by 506, in accordance with at least one example. Curve 532 illustrates that a voltage induced at output ports 362 and 364 of fano interferometric phase detector 300 may depend on phase difference 534 of input signals at input ports 352 and 354 of fano interferometric phase detector 300 and may increase as phase difference 534 of input signals increases until voltage signal reaches at a maximum amplitude at EIT peak 510 and that may occur when input signals are 180° out of phase, when input signals locks at frequency 506, in accordance with at least one example. Moreover, plot 500 shows that a change in voltage amplitude at output ports 362 and 364 is spectrally aligned with a frequency value pointed by 506. Accordingly, fano interferometric phase detector 300 may be utilized as a phase detector, which may enable accurate phase measurement for applications such as phase locked loop in automotive radar or MIMO systems, in accordance with at least one example.

Figure 5C:
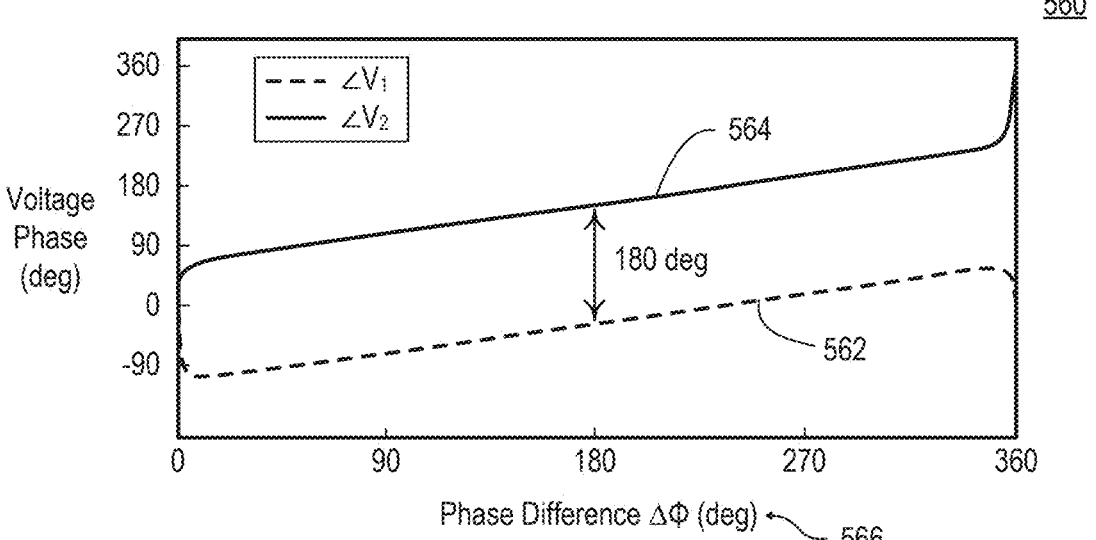
FIG. 5C is a phase plot of voltages at output ports of a fano interferometric phase detector of FIG. 3B, in accordance with at least one example.

FIG. 5C illustrates a plot 560 of phase of voltages at output ports 362 and 364 of fano interferometric phase detector 300 of FIG. 3B, in accordance with at least one example. Curve 562 represents phase of a voltage signal at output port 362 and curve 564 represents phase of a voltage signal at output port 364 with a varying phase difference of input signals of fano interferometric phase detector 300. In at least one example, curves 562 and 564 may follow a similar increasing pattern as phase difference 566 increases yet continuously maintain a 180° phase difference. Plot 560 illustrates that input signals of fano interferometric phase detector 300 can maintain a charge distribution in quarter wavelength stubs 304 and 306 in such a way that phase difference between two voltages at output ports 362 and 364 substantially remains 180° regardless of phase difference of signals at input ports 352 and 354.

Figure 6A:
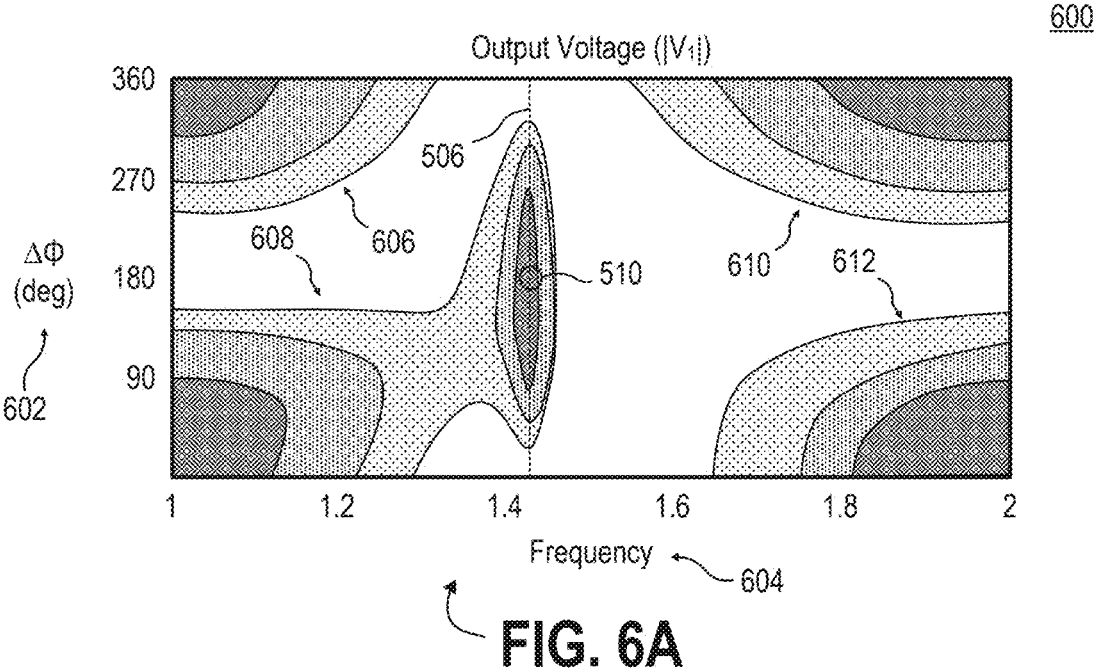
FIG. 6A is a magnitude plot of a voltage at a first output port of a fano interferometric phase detector illustrating its changing pattern with a variation in a phase difference of input signals, across a range of frequencies, in accordance with at least one example.

FIG. 6A illustrates a plot 600 of a voltage signal at output port 362 of fano interferometric phase detector 300 illustrating a change in magnitude with a variation in a phase difference 602 of input signals, across an operational frequency band 604, in accordance with at least one example. Plot 600 illustrates that output voltage of fano interferometric phase detector 300 at port 362 may comprise one or more clustered regions of varying amplitudes but variation patterns of amplitude signal at approximately 1.45 GHz pointed by 506 are consistent: voltage amplitude increases when a phase difference 602 of input signals increases until it reaches an EIT peak voltage 510 where its voltage amplitude is maximum, in accordance with at least one example. All other regions, such as regions 606, 608, 610, and 612 do not follow this variation pattern, illustrating that fano interferometric phase detector 300 may be used as a phase detector at a frequency value pointed by 506.

Figure 6B:
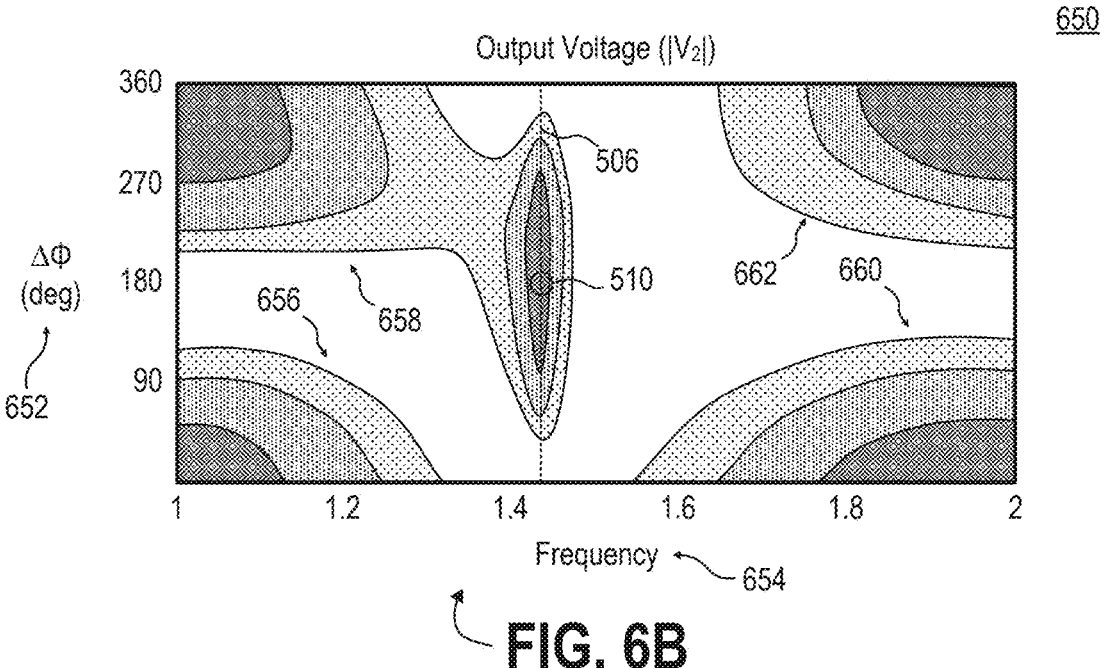
FIG. 6B is a magnitude plot of a voltage at a second output port of a fano interferometric phase detector illustrating its changing pattern with a variation in a phase difference of input signals, across a range of frequencies, in accordance with at least one example.

FIG. 6B is a plot 650 of a voltage signal at output port 364 of fano interferometric phase detector 300 illustrating a change in magnitude with a variation in a phase difference 652 of input signals, across an operational frequency band 654, in accordance with at least one example. Plot 650 illustrates that the output voltage of fano interferometric phase detector 300 at port 364 may comprise one or more clustered regions of varying amplitudes but variation patterns of amplitude signal at approximately 1.45 GHz pointed by 506 are consistent. For instance, voltage amplitude increases when a phase difference 652 of input signals increases until it reaches an EIT peak voltage 510 where its voltage amplitude is maximum. All other regions, such as regions 656, 658, 660, and 662 do not follow a continuous variation pattern hence, fano interferometric phase detector 300 may be used as a phase detector at a single frequency pointed by 506. In at least one example, regions 606, 608, 610, and 612 of plot 600 and regions 656, 658, 660, and 662 of plot 650 may have an inverse polarity of each other due to a consistent 180 phase difference in voltage signals at output ports 362 and 364, as shown by curves 562 and 564 in plot 560 of FIG. 5C.

Figure 7A:
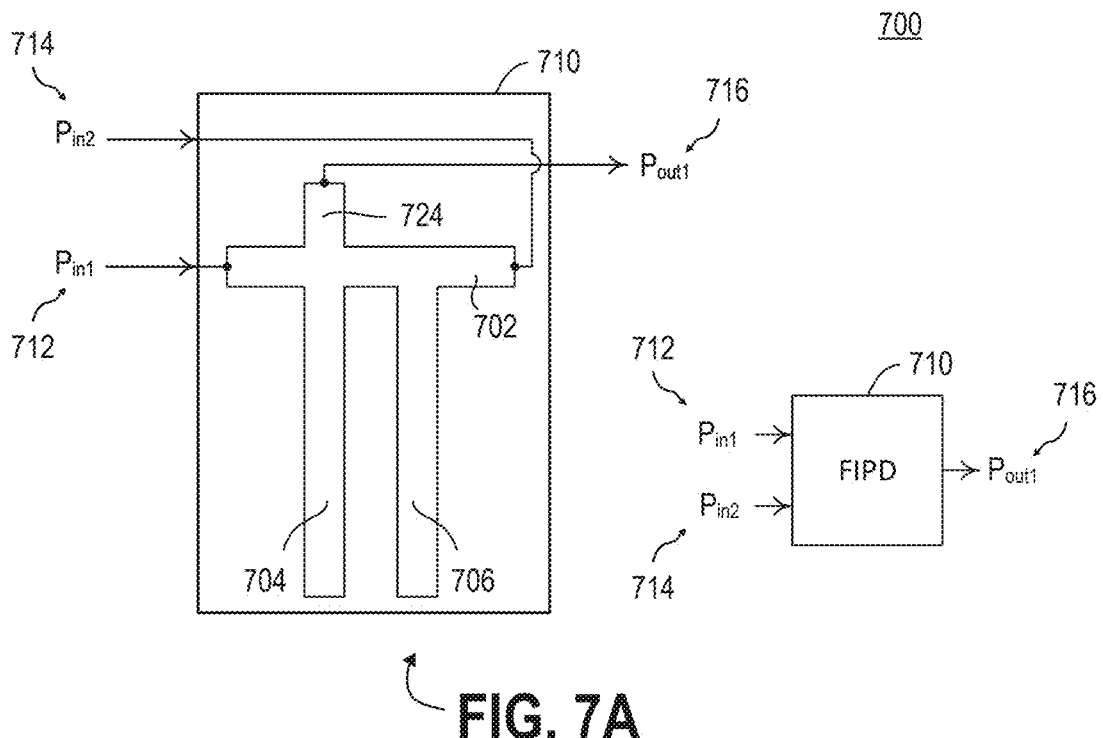
FIG. 7A is a schematic illustrating a first example structure and symbolic representation of a fano interferometric phase detector, in accordance with at least one example.

FIG. 7A is a schematic 700 illustrating a first example structure and a symbolic representation of a fano interferometric phase detector 710, in accordance with at least one example. Fano interferometric phase detector 710 comprises main transmission line 702, a first quarter wavelength stub 704, and a second quarter wavelength stub 706 similar to a main transmission line 302, first quarter wavelength stub 304, and second quarter wavelength stub 306 of fano interferometric phase detector 300. In at least one example, fano interferometric phase detector 710 comprises a single port line 724 similar to port line 324. Since both voltage signals at ports 362 and 364 in fano interferometric phase detector 300 are equal in amplitude, one port line (port line 724) may be enough for fano interferometric phase detector 710 to work as a phase detector in phase detection applications such as a PLL.

Fano interferometric phase detector 710 may have 3 ports, two input ports 712 and 714, and an output port 716. In at least one example, input port 712 is connected to a first end of main transmission line 702 and input port 714 is connected to a second end of main transmission line 702 and output port 716 is connected to an end of port line 724. Input signals may have a phase difference and are applied to ports 712 and 714 and due to their constructive or destructive interference a voltage is obtained at port 716, and its amplitude may depend on a phase difference of input signals.

Figure 7B:
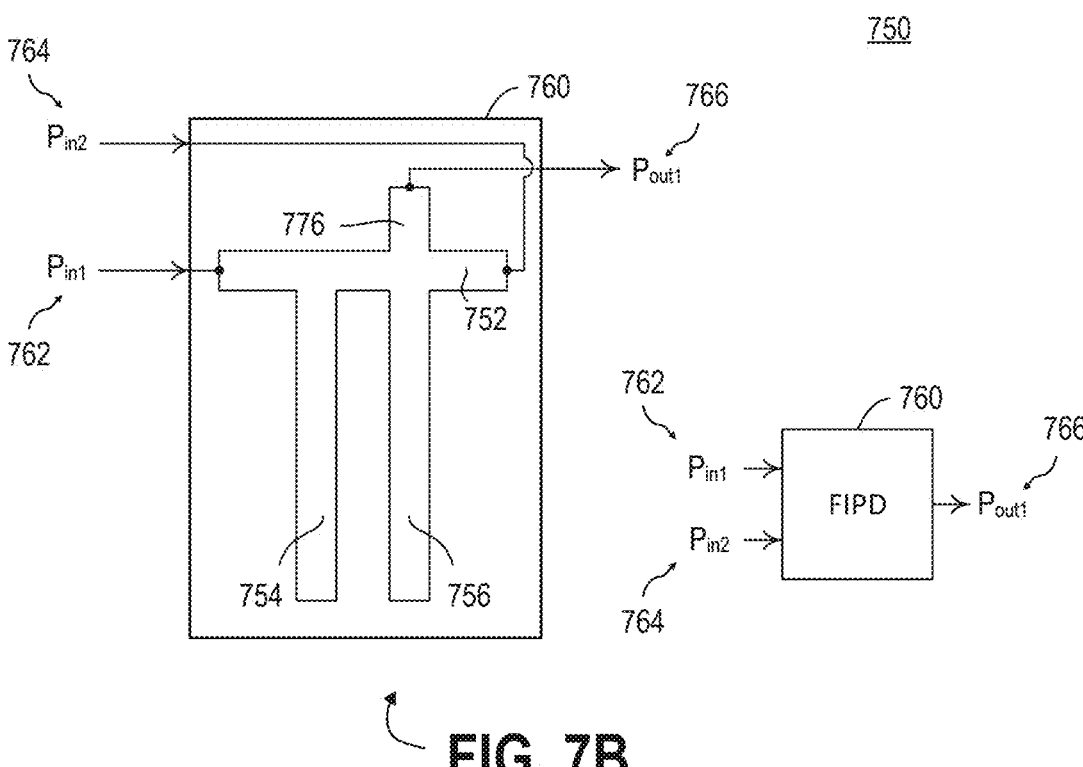
FIG. 7B is a schematic illustrating a second example structure and symbolic representation of a fano interferometric phase detector, in accordance with at least one example.

FIG. 7B is a schematic 750 illustrating a second example structure and a symbolic representation of a fano interferometric phase detector 760, in accordance with at least one example. Fano interferometric phase detector 760 comprises main transmission line 752, a first quarter wavelength stub 754, and a second quarter wavelength stub 756 similar to a main transmission line 302, first quarter wavelength stub 304, and a second quarter wavelength stub 306 of fano interferometric phase detector 300. In at least one example, fano interferometric phase detector 760 may comprise a port line 776 similar to port line 326. Since both voltage signals at ports 362 and 364 are equal in amplitude, one port line (port line 776) may be good enough to enable fano interferometric phase detector 760 to work as a phase detector in phase detection applications such as a PLL. Fano interferometric phase detector 760 may have 3 ports: two input ports 762 and 764 and an output port 766. In at least one example, input port 762 is connected to a first end of main transmission line 752 and input port 764 is connected to a second end of main transmission line 752 and output port 766 is connected to an end of port line 776. Input signals may have a phase difference and are applied to ports 762 and 764 and due to their constructive or destructive interference a voltage is obtained at port 766, and its amplitude may depend on the phase difference of the input signals.

In at least one example, symbol 710 in FIG. 7A and symbol 760 in FIG. 7B may represent a fano interferometric phase detector. In at least one example, voltage output is substantially equal in amplitude on both output ports, therefore, fano interferometric phase detectors 300, 710, and 760 may be symmetric apparatuses, where input signals may be swapped without disturbing an amplitude of an output voltage response signal.

Figure 8:
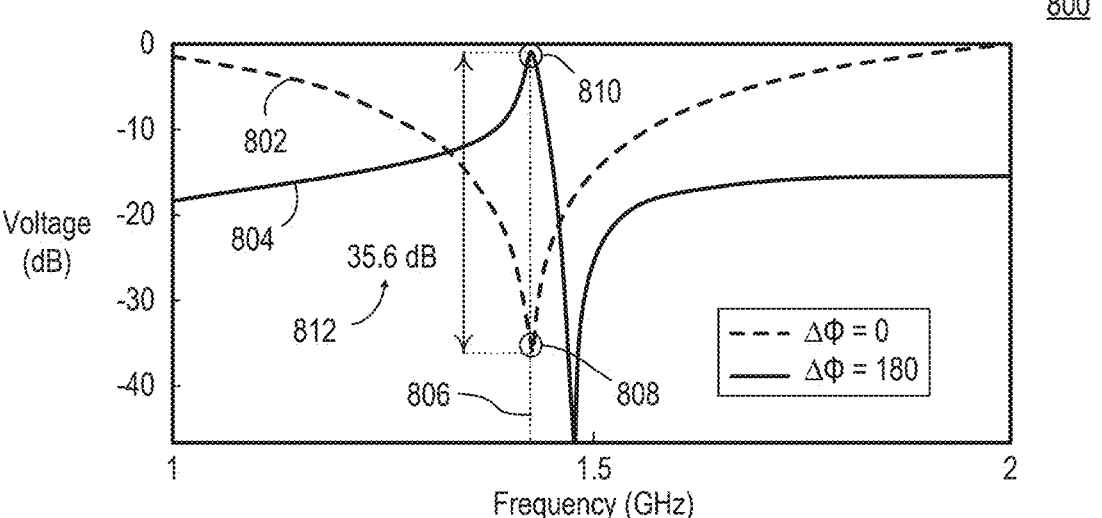
FIG. 8 is a magnitude plot of a voltage at an output port of a fano interferometric phase detector of FIG. 7A, in accordance with at least one example.

FIG. 8 illustrates a magnitude plot 800 of a voltage signal at an output port 716 of a fano interferometric phase detector 710 of FIG. 7A, in accordance with at least one example. Curve 802 shows a magnitude of output voltage signal at port 716 when input signals at ports 712 and 714 are in-phase ($\Delta\Phi=0$) and curve 804 shows a magnitude of output voltage signal at port 716 when input signals at ports 712 and 714 are out-of-phase ($\Delta\Phi=180$), in accordance with at least one example. Curve 802 may represent a Lorentzian response and like that of a Lorentzian response, shown by curve 502 ($U(\omega)=R_b(\omega)$ in Eq. 1). Curve 804 may represent a fano voltage response with an EIT peak 810 like that of a fano response of curve 504 ($U(\omega)=\sigma(\omega)$ in Eq. 1).

In at least one example, a dip 808 in curve 802 and EIT peak 810 of curve 804 are spectrally aligned at a frequency 1.45 GHz marked by 806 with an isolation 812 of 35.6 decibels. This illustrates that fano interferometric phase detector 710 may work as a phase detector like fano interferometric phase detector 300 in different applications such as automotive radars, MIMO systems, or any other systems that may need to accurately do phase detection with a higher degree of resolution.

In at least one example, fano interferometric phase detector 760 of FIG. 7B may have a substantially similar response of output voltage signal at port 766 as that of output voltage signal at port 716 of fano interferometric phase detector 710 of FIG. 7A. Fano interferometric phase detectors 710 and 760 are symmetric; therefore, a substantially similar response may be achieved enabling fano interferometric phase detector 760 to also accurately perform phase detection with a higher degree of resolution.

In at least one example, fano interferometric phase detector 760 of FIG. 7B may have a 180° shifted phase response of the output voltage signal at port 766 like output voltage response at port 716 of fano interferometric phase detector 710 of FIG. 7A. Since fano interferometric phase detectors 710 and 760 are symmetric, a substantially similar response in amplitude of voltage signals may also be achieved using fano interferometric phase detector 710, such that an increase in voltage signal may indicate an increased difference in phase of input signals. A phase shift of 180° within the output voltages at two portliness may not affect the functional behavior of fano interferometric phase detector 760 since only amplitude is significant for applications of fano interferometric phase detector 760 as a phase detector.

In at least one example, fano interferometric phase detectors 300, 710, and 760 may represent at least one or more examples of fano interferometric phase detector 166 of FIG.

1B, such that fano interferometric phase detectors 300, 710, and 760 may be used in a PLL such as PLL 160 of FIG. 1B.

Figure 9:
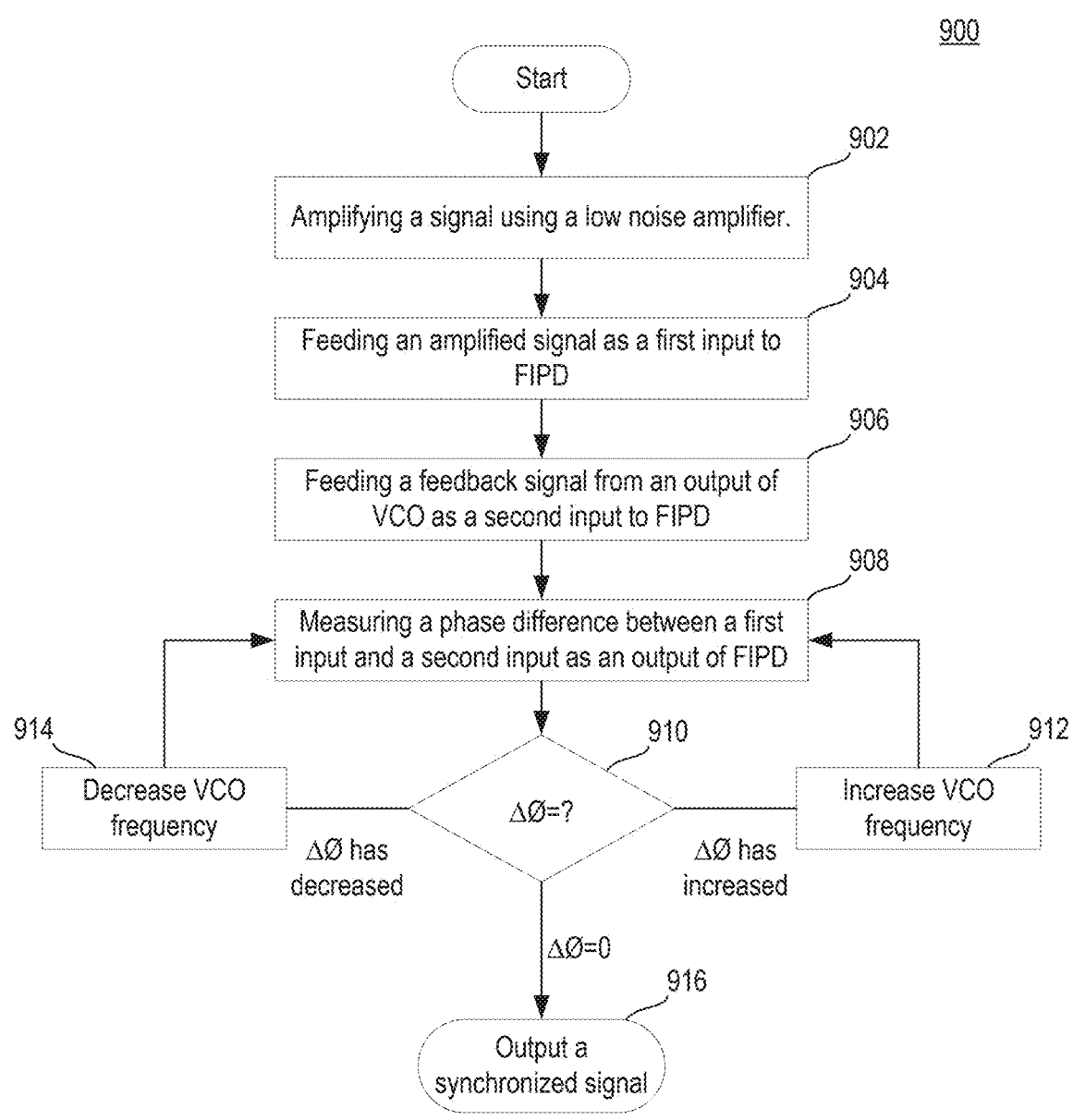
FIG. 9 is a flowchart illustrating a method of phase detection that may be used in a phase locked loop by a fano interferometric phase detector, in accordance with at least one example.

FIG. 9 is a flowchart illustrating a plot 900, a method of phase detection in a phase locked loop using a fano interferometric phase detector 166, in accordance with at least one example. At block 902, an input signal may be amplified using a low noise amplifier (LNA) 168, wherein an input signal may be a radar signal or a MIMO systems' signal, and it may be further given as a first input to a fano interferometric phase detector at block 904. A feedback signal from an output of VCO 180 is a second input to fano interferometric phase detector 166 at block 906. At block 908, fano interferometric phase detector 166 outputs an output signal, and its amplitude depends on a phase difference of a first input signal and a second input signal (feedback signal) as illustrated in plots 500 and 530. At decision box 910, if a phase difference between two input signals is approximately zero (e.g., an input signal is considered synchronized with a reference VCO signal), a synchronized signal from VCO 180 is output at block 916 and the method ends. If a phase difference between two signals is greater than a previous phase difference, a control voltage may be adjusted to increase a frequency of VCO 180 at block 912 and the method resumes at block 908. If a phase difference between two signals is less than a previous phase difference, a control voltage is adjusted to decrease a frequency of VCO 180 at block 914 and the method resumes at block 908. A first loop represented by blocks 908, 910, and 912, and a second loop represented by blocks 908, 910, and 914, are iteratively executed until an input signal is synchronized with a reference VCO signal.

Figure 10:
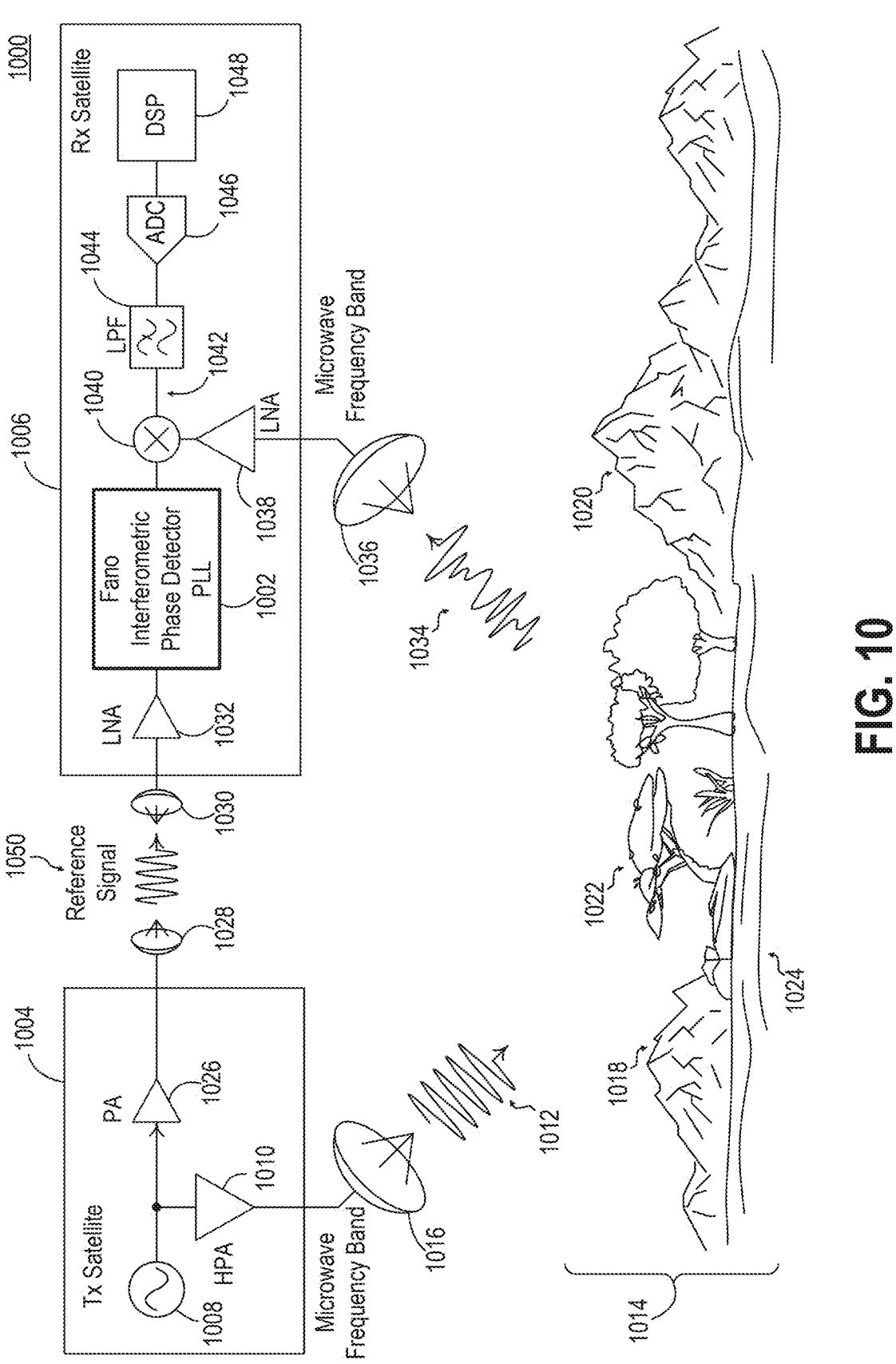
FIG. 10 is schematic illustrating a synthetic aperture radar (SAR) satellite system that may include a fano interferometric phase detector based PLL for radar imaging and signal processing, in accordance with at least one example.

FIG. 10 is a schematic illustrating a synthetic aperture radar (SAR) satellite system 1000 that may include a fano interferometric phase detector based PLL 1002 for radar imaging and signal processing, in accordance with at least one example. SAR receiver satellites synchronize a reference signal with an input signal using a PLL that includes frequency dividers. These frequency dividers introduce jitter, phase inaccuracy, and are slow in locking. PLL 1002 alleviates these discrepancies using FIPD that works without dividing the reference signal. SAR satellite system 1000 may include a transmit satellite 1004 and multiple receive satellites, such as receive satellite 1006 that may include a fano interferometric phase detector based PLL 1002. Transmit satellite 1004 may include an oscillator 1008 that may generate a stable high-frequency signal, which may be then amplified by a high-power amplifier 1010 and an electromagnetic signal 1012 may be transmitted towards earth 1014 via a primary transmission dish 1016 to illuminate a sector of earth 1014.

In at least one example, frequency band of SAR satellite system 1000 may operate in C-band, L-band, or Ku-band. In at least one example, signal 1012 may also be incident on mountains 1018, 1020, tree 1022, and land 1024. Consequently, signal 1012 may experience distortions because of doppler shift, phase noise, multipath fading, atmospheric interference, and surface scattering. To facilitate a coherent reception, a reference signal may be independently amplified using a power amplifier 1026 and a reference signal 1050 may be transmitted separately via a reference signal dish 1028. In at least one example, receive satellite 1006 may be equipped with a reference signal reception path and an earth-reflected signal reception path. Reference reception path may include a receiving dish 1030 that may capture a transmitted reference signal 1050 from transmission dish 1028, which may be subsequently amplified using a low-noise amplifier (LNA) 1032 before feeding it into a fano interferometric phase detector based PLL 1002. Simultaneously, an earth-reflected signal 1034, which may have experienced distortions such as doppler shifts, phase noise, multipath fading, atmospheric interference, and surface scattering, is received by a dish 1036. Signal 1034 is amplified using an LNA 1038 and then mixed with an output of a fano interferometric phase detector based PLL 1002 using a mixer 1040. Mixed signal 1042 is filtered using a low-pass filter 1044 to remove unwanted high-frequency components and then subsequently converted from an analog to a digital signal by an analog-to-digital converter (ADC) 1046 and then forwarded to a digital signal processing (DSP) block 1048.

Since frequency dividers may not be used in a fano interferometric phase detector based PLL 1002; therefore, earth-reflected signal 1034 received by dish 1036 may fast lock onto a high-frequency reference signal 1050 received by dish 1030. Moreover, a reduced phase noise and jitter (due to an absence of frequency dividers) in earth-reflected signal 1034 and high-frequency reference 1050 may not only quickly synchronize them but also accurately measure a phase difference between them. As a result, coherence between two signals, and because of that, synchronization resolution between two signals also improves. These characteristics of a SAR radar satellite system may be relevant for SAR imaging applications that need high resolution spectral images. Some of these applications may include ocean tracking, river and ice flow monitoring, deforestation monitoring, wildfire spread monitoring, crops yield prediction and estimating damages after natural disasters.

Throughout specification, and in claims, "connected" may generally refer to a direct connection, such as electrical, mechanical, or magnetic connection between things that are connected, without any intermediary devices.

Here, "signal" may generally refer to at least one current signal, voltage signal, magnetic signal, or data/clock signal.

Here, "phase detector" may generally refer to a circuit component that can compare a phase of an input signal with a reference signal. The phase detector may generate an output signal representing the phase difference, which may be used to adjust the frequency or phase of the input signal within a phase-locked loop (PLL).

Here, "low pass filter" may generally refer to a circuit that allows signals with frequencies below a specified cutoff frequency to pass, while attenuating signals with higher frequencies. In a phase-locked loop (PLL), a low pass filter may smoothen an output signal of a phase detector by removing high-frequency noise components to generate a stable control signal.

Here, "charge pump" may generally refer to a circuit that can convert electrical signals from one form to another. In a phase-locked loop (PLL), a charge pump may convert the phase detector's output into a direct current (DC) control voltage for tuning a voltage-controlled oscillator (VCO).

Here, "frequency divider" may generally refer to a circuit that reduces a given frequency of an input signal by a prescribed integer factor. A frequency divider in a phase-locked loop (PLL) may divide an output frequency of a voltage-controlled oscillator (VCO) to produce a signal that is suitable for a comparison with a reference signal in a phase detector.

Here, "voltage-controlled oscillator" (VCO) may generally refer to an oscillator and its output frequency is controlled by one or more input voltages. In a PLL, a VCO adjusts its frequency based on a control voltage, generated by a charge pump, and low pass filter to achieve phase lock with a reference signal.

Here, "fine control voltage" may generally refer to a precise voltage signal applied to a VCO for small adjustments in a frequency of a given signal. Fine control voltage enables high-resolution tuning in applications that may need accurate frequency synthesis.

Here, "coarse control voltage" may generally refer to a voltage signal applied to a voltage-controlled oscillator (VCO) for making large-scale adjustments in a frequency of a given signal. Coarse control voltage may complement fine control voltage to cover a broader frequency range in a phase-locked loop (PLL).

Here, "phase-locked loop" (PLL) may generally refer to a feedback control system that may synchronize phase and frequency of an output signal to a reference signal. A PLL typically consists of a phase detector, a low pass filter, a charge pump, a voltage-controlled oscillator (VCO), and optionally a frequency divider.

Here, "phase difference" may generally refer to an angular displacement between two signals of the same frequency, expressed in degrees or radians. Phase difference is typically measured by a phase detector in a phase-locked loop (PLL) and typically represents a synchronization error.

Here, "phase lock" may generally refer to a condition where an output signal of a phase-locked loop (PLL) matches a reference signal in both frequency and phase. Phase lock is achieved when phase difference is minimized and maintained within a tolerable range.

Here, "dividing factor" may generally refer to a ratio by which a frequency divider reduces frequency of an input signal. Dividing factor may influence operational frequency range and stability of a phase-locked loop (PLL).

Here, "operational frequency" may generally refer to a frequency range over which a circuit or system, such as a phase-locked loop (PLL), performs its intended functions. In at least one example, operational frequency refers to a performance range of phase detector.

Here, "phase accuracy" may generally refer to precision with which a phase of an output signal aligns with a reference signal in a phase-locked loop (PLL). High phase accuracy is needed in applications that need to operate in an environment that has low phase noise and timing errors.

Here, "port assignment" may generally refer to an allocation of input and output terminals in a circuit for very specific functions. In at least one example, port assignment may define where input signals are applied and where output signals are received in a fano resonator or a fano interferometric phase detector.

Here, "node" may generally refer to a junction in an electrical circuit where two or more components are connected. In at least one example, a node is a junction of a main transmission line and a quarter wavelength stub.

Here, "port line" may generally refer to a conductive path that connects ports to other circuit components. In at least one example, a port line is an extension above microstrip transmission line, concurrent to a quarter wavelength stub, which carries a voltage corresponding to a phase difference of input signals.

Here, "stub spacing" may generally refer to a distance between adjacent quarter-wavelength stubs on a main transmission line. Stub spacing may influence signal impedance, resonance, and phase characteristics in RF and microwave circuits.

Here, "in-phase" may generally refer to a condition where two signals of the same frequency may have identical phase angles.

Here, "out-of-phase" may generally refer to a condition in which two signals of the same frequency have a phase difference of 180 degrees or any another value causing destructive interference.

Here, "Lorentzian response" may generally refer to a spectral response characterized by a symmetric curve described by a Lorentzian function. A Lorentzian response may occur in systems with a single resonant mode, such as a phase detector, where the response amplitude peaks at a resonance frequency and falls off symmetrically on either side when input signals are in-phase.

Here, "fano response" may generally refer to a spectral response exhibiting an asymmetric line shape due to an interference between a discrete resonant mode and a continuum of states. In at least one example, fano interferometric phase detector exhibits a fano response when input signals are out-of-phase.

Here, "EIT peak" may generally refer to a sharp spectral feature characterized by a narrow transmission peak within an absorption band. An EIT peak may result from quantum interference effects in systems where resonant and non-resonant pathways are coherently coupled, enabling applications to do precise signal filtering, and phase detection.

Here, "spectral alignment" may generally refer to a process of synchronizing frequency components of multiple signals to achieve optimal performance. In at least one example, spectral alignment refers to an alignment of Lorentzian dip and EIT peak.

Here, "charge distribution" may generally refer to a spatial arrangement of electrical charges in a circuit.

Here, "background continuum state" may generally refer to a condition where signals outside a primary operational band form a continuous spectrum.

Here, "conductive trace" may generally refer to a patterned layer of conductive material on a circuit board that carries electrical signals. Conductive traces may connect components such as phase detectors, voltage-controlled oscillators (VCOs), and charge pumps in a phase-locked loop (PLL).

Here, "resonance dip" may generally refer to frequencies at which a structure resonates. Resonance dip may refer to a fundamental resonance frequency that a spiral resonator structure supports or some multiples of the fundamental resonance frequency.

Here, "dielectric core" may generally refer to a cuboidal, non-conductive material that separates conductive layers in electronic devices. An example of a dielectric core is Rogers RO4003, which supports the fano interferometric phase detector and other components.

Here, "main transmission line" may generally refer to a type of electrical transmission line used to convey frequency signals where the main transmission line is on top of a dielectric core, connecting quarter wavelength stubs, and port lines.

Here, "quarter wavelength stub" may generally refer to a conductive path that carries RF signals. One example of quarter wavelength stub is an open ended conductive line connected to a main transmission line with a length of a quarter of a wavelength of a frequency.

Here, "open-ended stub" may generally refer to a conductive path that terminates at an open end.

Here, "fano resonator" may generally refer to a main transmission line terminated by one or more open or short circuit stubs. A fano resonator may include one or more open-ended stubs that contribute to resonance dips enhancing the performance of the resonator.

Here, "fano interferometric phase detector" may generally refer to a phase detector comprising a main transmission line terminated by one or more open or short circuit stub and a port line. A fano interferometric phase detector may include one or more open-port lines that output a signal whose amplitude depends on a phase difference of two input signals applied at each input port at each end of the main transmission line.

Here, "ground plane" may generally refer to a conducting layer used to provide a reference voltage in electronic circuits. A ground plane may be a layer on the bottom surface of a dielectric core that overlaps with a main transmission line, one or more quarter wavelength stubs, and one or more port lines, affecting field distribution.

Here, "port" may generally refer to point where frequency signals are applied or received. Signals may be applied at terminals at ends of a main transmission line through which signals are inputted into a fano interferometric phase detector. Signals may be received at terminal at an end of a port line through which signals are outputted from a fano interferometric phase detector.

Here, "resonance frequency" may generally refer to the frequency at which a system naturally oscillates with a maximum amplitude. Resonance frequency may be a frequency at which a fano resonator or fano interferometric phase detector generates resonance dips.

Here, "crystal source" may generally refer to an electronic oscillator circuit that uses mechanical resonance of a vibrating crystal to generate a precise frequency signal. A crystal source may provide a stable reference signal in a phase-locked loop (PLL) for comparing frequency and phase.

Here, "reference signal" may generally refer to a signal used as a standard for comparison in a phase-locked loop (PLL). A reference signal may arise from a crystal source and may have a fixed frequency and phase and is applied to a phase detector to determine phase difference relative to an input signal.

Here, meaning of "a," "an," and "the" include plural references. Here, meaning of "in" includes "in" and "on."

Unless otherwise specified use of ordinal adjectives "first," "second," and "third," etc., to describe a common object, merely indicate that different instances of like objects are being referred to and are not intended to imply that objects so described must be in a given sequence, either temporally, spatially, in ranking or in any other manner.

For purposes of present disclosure, phrases "A and/or B" and "A or B" mean (A), (B), or (A and B). In at least one example, phrase "A, B, and/or C" means (A), (B), (C), (A and B), (A and C), (B and C), or (A, B and C).

Reference in specification to "an example," "one example," "in at least one example," "some examples," or "other examples" means that a particular feature, structure, or characteristic described in connection with examples is included in some examples. Various appearances of "an example," "one example," "in at least one example," or "some examples" are not necessarily all referring to the same examples. If specification states a component, feature, structure, or characteristic "may," "might," or "could" be included, that particular component, feature, structure, or characteristic is not required to be included. If specification or claim refers to "a" or "an" element, that does not mean there is only one of elements. If specification or claims refer to "an additional" element, that does not preclude there being more than one of additional elements.

In at least one embodiment, structures described herein can also be described as method(s) of forming those structures or apparatuses, and method(s) of operation of these structures or apparatuses. The following examples are provided that illustrate at least one embodiment. An example can be combined with any other example. As such, at least one example can be combined with at least another example without changing scope of an example.

Example 1 is a fano interferometric phase detector comprising: a dielectric core with a top surface and a bottom surface, wherein the top surface and the bottom surface are substantially parallel; a main transmission line on the top surface; a first quarter wavelength stub on the top surface electrically coupled to the main transmission line; a second quarter wavelength stub on the top surface electrically coupled to the main transmission; a port line on the top surface, wherein the port line is an extension above the main transmission line; and a ground plane on the bottom surface, wherein the dielectric core insulates the ground plane from the main transmission line, first and second quarter wavelength stub, and port line.

Example 2 is a fano interferometric phase detector according to any examples herein, in particular example 1, wherein the first and second quarter wavelength stubs are open circuit stubs that are substantially spaced and extending away from the main transmission line.

Example 3 is a fano interferometric phase detector according to any examples herein, in particular example 1, wherein a shape of the first quarter wavelength stub or the second quarter wavelength stub of the fano interferometric phase detector has one of straight-edge shape, polygonal shape, circular shape, elliptical shape, or any combination thereof.

Example 4 is a fano interferometric phase detector according to any examples herein, in particular example 1, wherein the dielectric core comprises one or more dielectric materials.

Example 5 is a fano interferometric phase detector according to any examples herein, in particular example 1, wherein the main transmission line comprises a first port on a first end and a second port on a second end, and wherein the first and second ports are input ports.

Example 6 is a fano interferometric phase detector according to any examples herein, in particular example 1, wherein the port line comprises a port on an end, and wherein the port is an output port.

Example 7 is a fano interferometric phase detector according to any examples herein, in particular example 1, wherein the ground plane substantially overlaps the main transmission line, first and second quarter wavelength stubs, and port line.

Example 8 is a fano interferometric phase detector comprising: a dielectric core with a top surface and a bottom surface, wherein the top surface and the bottom surface are substantially parallel; a main transmission line on the top surface; a first quarter wavelength stub on the top surface electrically coupled to the main transmission line; a second quarter wavelength stub on the top surface electrically coupled to the main transmission line; one or more port lines on the top surface, wherein an individual port line of the one or more port lines is an extension above the main transmission line; and a ground plane on the bottom surface, wherein the dielectric core insulates the ground plane from the main transmission line, first and second quarter wavelength stub, and one or more port lines.

Example 9 is a fano interferometric phase detector according to any examples herein, in particular example 8, wherein the first and second quarter wavelength stubs are open circuit stubs that are substantially spaced and extending away from the main transmission line.

Example 10 is a fano interferometric phase detector according to any examples herein, in particular example 8, wherein a shape of the first quarter wavelength stub or the second quarter wavelength stub of the fano interferometric phase detector has one of straight-edge shape, polygonal shape, circular shape, elliptical shape, or any combination thereof.

Example 11 is a fano interferometric phase detector according to any examples herein, in particular example 8, wherein the dielectric core comprises one or more dielectric materials.

Example 12 is a fano interferometric phase detector according to any examples herein, in particular example 8, wherein the main transmission line comprises a first port on a first end and a second port on a second end, and wherein the first and second ports are input ports.

Example 13 is a fano interferometric phase detector according to any examples herein, in particular example 8, wherein a port line of the one or more port lines comprises a port on an end, and wherein the port is an output port.

Example 14 is a fano interferometric phase detector according to any examples herein, in particular example 8, wherein the ground plane substantially overlaps the main transmission line, first and second quarter wavelength stubs, and one or more port lines.

Example 15 is a fano interferometric phase detector according to any examples herein, in particular example 8, wherein the individual port line is aligned with the first or second quarter wavelength stub.

Example 16 is a phase locked loop comprising: a fano interferometric phase detector configured to receive an input signal and a feedback signal, wherein the fano interferometric phase detector outputs an output signal depending on a phase difference of the input signal and the feedback signal; a loop filter to receive the output signal from the fano interferometric phase detector, perform a filtering operation on the output signal, and produce a fine control value associated with the phase difference between the input signal and the feedback signal; a voltage controlled oscillator configured to receive the fine control value from the loop filter and produce a VCO output with its phase adjusted based on the fine control value, wherein the VCO output is served as a phase locked loop output, and wherein the phase locked loop output is a feedback signal to be fed into the fano interferometric phase detector; and wherein the feedback signal is aligned with the input signal when the feedback signal and the input signal are in-phase and their frequencies are equal or close to each other within an acceptable frequency accuracy.

Example 17 is a phase locked loop according to any examples herein, in particular example 16, wherein the fano interferometric phase detector comprises: a main transmission line, wherein the input signal is applied to a first end of the main transmission line and the feedback signal is applied to a second end of the main transmission line; a first quarter wavelength stub; a second quarter wavelength stub, wherein the first and second quarter wavelength stubs are electrically coupled to the main transmission line and wherein the first and second quarter wavelength stubs are open-circuit stubs extending away from the main transmission line, wherein the first and second quarter wavelength stub are substantially spaced along main transmission line; one or more port lines, wherein an individual port line of the one or more port lines is an extension above the main transmission line, wherein the phase error signal is output from a port line of the one or more port lines, and wherein the main transmission line, first and second quarter wavelength stubs, and one or more port lines lie on top of a dielectric core; and a ground plane on bottom of the dielectric core.

Example 18 is a phase locked loop according to any examples herein, in particular example 16, wherein the phase error signal is rectified using a rectifier or fed into an AC-to-DC charge pump to be charge pumped before being filtered by the loop filter.

Example 19 is a phase locked loop according to any examples herein, in particular example 16, wherein the reference signal is any signal that a phase locked loop is configured to synchronize with.

Example 20 is a phase locked loop according to any examples herein, in particular example 16, wherein the voltage controlled oscillator is controlled using a coarse control value from a frequency controller to control a frequency of voltage controlled oscillator.

Example 21 is a fano interferometric phase detector according to any examples herein, in particular example 1 and example 8, wherein the first and second quarter wavelength stubs comprise an electrical length of a quarter wavelength.

What is claimed is:

1. A fano interferometric phase detector comprising:
a dielectric core with a top surface and a bottom surface, wherein the top surface and the bottom surface are substantially parallel;
a main transmission line on the top surface;
a first quarter wavelength stub on the top surface electrically coupled to the main transmission line;
a second quarter wavelength stub on the top surface electrically coupled to the main transmission line;
a port line on the top surface, wherein the port line is an extension above the main transmission line; and
a ground plane on the bottom surface, wherein the dielectric core insulates the ground plane from the main transmission line, the first quarter wavelength stub, the second quarter wavelength stub, and the port line.

2. The fano interferometric phase detector of claim 1, the first quarter wavelength stub, the second quarter wavelength stub are open circuit stubs that are spaced and extending away from the main transmission line.

3. The fano interferometric phase detector of claim 1, wherein a shape of the first quarter wavelength stub or the second quarter wavelength stub of the fano interferometric phase detector has one of straight-edge shape, polygonal shape, circular shape, elliptical shape, or any combination thereof.

4. The fano interferometric phase detector of claim 1, wherein the dielectric core comprises one or more dielectric materials.

5. The fano interferometric phase detector of claim 1, wherein the main transmission line comprises a first port on a first end and a second port on a second end, and wherein the first and second ports are input ports.

6. The fano interferometric phase detector of claim 1, wherein the port line comprises a port on an end, and wherein the port is an output port.

7. The fano interferometric phase detector of claim 1, wherein the ground plane substantially overlaps the main transmission line, the first quarter wavelength stub, the second quarter wavelength stub, and the port line.

8. A fano interferometric phase detector comprising:
a dielectric core with a top surface and a bottom surface, wherein the top surface and the bottom surface are substantially parallel;
a main transmission line on the top surface;

a first quarter wavelength stub on the top surface electrically coupled to the main transmission line;
a second quarter wavelength stub on the top surface electrically coupled to the main transmission line;
a first port line on the top surface and coupled to the main transmission line and the first quarter wavelength stub;
a second port line on the top surface and coupled to the main transmission line and the second quarter wavelength stub; and
a ground plane on the bottom surface, wherein the dielectric core insulates the ground plane from the main transmission line, the first quarter wavelength stub, the second quarter wavelength stub, and the first and second port lines.

9. The fano interferometric phase detector of claim 8, wherein the first quarter wavelength stub, the second quarter wavelength stub are open circuit stubs that are substantially spaced and extending away from the main transmission line.

10. The fano interferometric phase detector of claim 8, wherein a shape of the first quarter wavelength stub or the second quarter wavelength stub of the fano interferometric phase detector has one of straight-edge shape, polygonal shape, circular shape, elliptical shape, or any combination thereof.

11. The fano interferometric phase detector of claim 8, wherein the dielectric core comprises one or more dielectric materials.

12. The fano interferometric phase detector of claim 8, wherein the main transmission line comprises:
a first input port on a first end of the main transmission line; and
a second input port on a second end of the main transmission line, wherein the first end and the second end are opposite to one another.

13. The fano interferometric phase detector of claim 8, wherein the first and second port lines are first and second output ports.

14. The fano interferometric phase detector of claim 8, wherein the ground plane substantially overlaps the main transmission line, the first quarter wavelength stub, the second quarter wavelength stub, and the first and second port lines.

15. The fano interferometric phase detector of claim 8, wherein the first port line is aligned with the first quarter wavelength stub, and wherein the second port line is aligned with the second quarter wavelength stub.

16. A phase locked loop comprising:
a fano interferometric phase detector configured to receive an input signal and a feedback signal, wherein the fano interferometric phase detector outputs a phase error signal depending on a phase difference of the input signal and the feedback signal;
a loop filter to receive the phase error signal from the fano interferometric phase detector, perform a filtering operation on the phase error signal, and produce a fine control value based on the phase difference between the input signal and the feedback signal; and
a voltage controlled oscillator configured to receive the fine control value from the loop filter and produce a voltage control oscillator (VCO) output with its phase adjusted based on the fine control value, wherein the VCO output is served as a phase locked loop output, wherein the phase locked loop output is a feedback signal to be fed into the fano interferometric phase detector, and wherein the feedback signal is aligned with the input signal when the feedback signal and the input signal are in-phase and their frequencies are equal or close to each other within an acceptable tolerance limit.

17. The phase locked loop of claim 16, wherein the fano interferometric phase detector comprises:

a main transmission line, wherein the input signal is applied to a first end of the main transmission line and the feedback signal is applied to a second end of the main transmission line;

a first quarter wavelength stub;

a second quarter wavelength stub, wherein the first quarter wavelength stub and the second quarter wavelength stub are electrically coupled to the main transmission line, wherein the first quarter wavelength stub and the second quarter wavelength stub are open-circuit stubs extending away from the main transmission line, and wherein the first quarter wavelength stub and the second quarter wavelength stub are spaced along the main transmission line;

one or more port lines, wherein an individual port line of the one or more port lines is an extension above the main transmission line, wherein the phase error signal is output from a port line of the one or more port lines, and wherein the main transmission line, the first quarter wavelength stub, the second quarter wavelength stub, and the one or more port lines are etched on a top surface of a dielectric core; and a ground plane is etched on a bottom surface of the dielectric core.

18. The phase locked loop of claim 16, wherein the phase error signal is rectified using a rectifier or fed into an AC-to-DC charge pump to be charge pumped before being filtered by the loop filter.

19. The phase locked loop of claim 16, wherein the phase locked loop is configured to synchronize with the input signal.

20. The phase locked loop of claim 16, wherein the VCO is controlled using a coarse control value from a frequency controller to tune an operational frequency of the VCO.

\* \* \* \* \*